(12) United States Patent
DeWitt et al.

(10) Patent No.: US 9,780,429 B2
(45) Date of Patent: Oct. 3, 2017

(54) 3D-MICROSTRIP BRANCHLINE COUPLER

(71) Applicant: INTERNATIONAL BUSINESS MACHINES CORPORATION, Armonk, NY (US)

(72) Inventors: Barbara S. DeWitt, Essex Junction, VT (US); Essam Mina, South Burlington, VT (US); B M Farid Rahman, Columbia, SC (US); Guoan Wang, Columbia, SC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/885,393

(22) Filed: Oct. 16, 2015

(65) Prior Publication Data

US 2017/0110778 A1    Apr. 20, 2017

(51) Int. Cl.
*H01P 5/12* (2006.01)
*H01P 3/08* (2006.01)
*H01P 11/00* (2006.01)

(52) U.S. Cl.
CPC ............ *H01P 3/081* (2013.01); *H01P 11/001* (2013.01)

(58) Field of Classification Search
CPC .................................... H01P 5/12; H01P 5/16
USPC ......... 333/109, 110, 111, 112, 116, 117, 185
See application file for complete search history.

(56) References Cited

U.S. PATENT DOCUMENTS

| 9,035,719 B2 | 5/2015 | Dewitt et al. |
| 2012/0119969 A1 | 5/2012 | MacDonald et al. |
| 2013/0159957 A1 | 6/2013 | Ding et al. |
| 2014/0184460 A1 | 7/2014 | Yen |

FOREIGN PATENT DOCUMENTS

CN        102709275 A      10/2012

OTHER PUBLICATIONS

Yang et al., A New Compact 3-D Hybrid Coupler Using Multi-Layer Microstrip Line at 15 GHz, Sep. 2006, Proceedings of the 36th European Microwave Conference, 4 pages.*

(Continued)

*Primary Examiner* — Dean Takaoka
(74) *Attorney, Agent, or Firm* — Steven Meyers; Andrew M. Calderon; Roberts Mlotkowski Safran Cole & Calderon P.C.

(57) ABSTRACT

The disclosure is directed to semiconductor structures and, more particularly, to a three dimensional microstrip branchline coupler and methods of manufacture. The structure includes a plurality of through silicon vias and conductive lines electrically connected to a first end and a second end of respective ones of the plurality of through silicon vias. A first through silicon via of the plurality of through silicon vias forms a first port of a three dimensional (3D) branchline coupler. A second through silicon via of the plurality of through silicon vias forms a second port of the 3D branchline coupler. A third through silicon via of the plurality of through silicon vias forms a third port of the 3D branchline coupler. A fourth through silicon via of the plurality of through silicon vias forms a fourth port of the 3D branchline coupler.

20 Claims, 3 Drawing Sheets

(56) References Cited

OTHER PUBLICATIONS

Jin et al., "Antenna-in-Package Design Based on Wafer-Level Packaging With Through Silicon via Technology," Components, Packaging and Manufacturing Technology, IEEE Transactions, 2013, vol. 3, Issue 9, pp. 1498-1505.
Hettak et al., "A Novel Compact Three-Dimensional CMOS Branch-Line Coupler using the Meandering ECPW, TFMS, and Buried Micro Coaxial Technologies at 60 GHz," IEEE, 2010, Canada, pp. 1576-1579.
Kuo et al., "Miniature 60 GHz slow-wave CPW branch-line coupler using 90 nm digital CMOS process," Electronics Letters Aug. 2011, vol. 47, No. 16, 2 pages.
Wang et al., "Novel On-Chip Performance Slow Wave Structure using Discontinuous Microstrip Lines and Multi-layer Ground for Compact Millimeter Wave Applications," Electronics Components and Technology Conference, Essex Junction, Vermont, 2009, pp. 1606-1611.
Titz et al., "New Wideband Integrated Miniature Branchline Coupler for Beamforming Applications," IEEE 2012, France, 3 pages.
Laemmle et al., "Directional Couplers from 30 to 140 GHz in Silicon," Proceedings of Asia-Pacific Microwave Conference, Germany, 2010, pp. 806-809.
Hettak et al., "A New Compact 3D SiGe 90 Hybrid Coupler using the Meandering TFMS and Shielded Strip line at 20 GHz," Proceedings of the 39th European Microwave Conference, Sep. 29-Oct. 1, 2009, Canada, pp. 1163-1166.
List of IBM Patents or Patent Applications Treated as Related 1 page.
Specification "3D-Microstrip Branchline Coupler" and Drawings in U.S. Appl. No. 15/668,931, filed Aug. 4, 2017, 15 pages.

\* cited by examiner

3D-MICROSTRIP BRANCHLINE COUPLER

BACKGROUND

The invention relates to semiconductor structures and, more particularly, to a three dimensional microstrip branchline coupler and methods of manufacture.

A branchline coupler is a four-port network device with a 90° phase difference between two coupled ports. The device can be used for a single antenna transmitter/receiver system or I/Q up/down converters and balanced amplifiers for wireless communication systems.

SUMMARY

In an aspect of the invention, a structure comprises: a plurality of through silicon vias; and conductive lines electrically connected to a first end and a second end of respective ones of the plurality of through silicon vias. A first through silicon via of the plurality of through silicon vias forms a first port of a three dimensional (3D) branchline coupler. A second through silicon via of the plurality of through silicon vias forms a second port of the 3D branchline coupler. A third through silicon via of the plurality of through silicon vias forms a third port of the 3D branchline coupler. A fourth through silicon via of the plurality of through silicon vias forms a fourth port of the 3D branchline coupler.

In an aspect of the invention, a structure comprises: a first through silicon via forming a first port of a three dimensional (3D) branchline coupler; a second through silicon via forming a second port of the 3D branchline coupler; a third through silicon via forming a third port of the 3D branchline coupler; and a fourth through silicon via forming a fourth port of the 3D branchline coupler; a first conductive line electrically connected to a first end of the first and third of the plurality of through silicon vias between port #1 and port #3; a second conductive line connected to the first end of the second and fourth of the plurality of through silicon vias between port #2 and port #4; a third conductive line connected to a second end of the first and second of the plurality of through silicon vias; and a fourth conductive line connected to the second end of the third and fourth of the plurality of through silicon vias.

In an aspect of the invention, a method comprises: forming a first through silicon via forming a first port of a three dimensional (3D) branchline coupler; forming a second through silicon via forming a second port of the 3D branchline coupler; forming a third through silicon via forming a third port of the 3D branchline coupler; forming a fourth through silicon via forming a fourth port of the 3D branchline coupler; forming a first conductive line electrically connected to a first end of the first and third of the plurality of through silicon vias between port #1 and port #3; forming a second conductive line connected to the first end of the second and fourth of the plurality of through silicon vias between port #2 and port #4; forming a third conductive line connected to a second end of the first and second of the plurality of through silicon vias; and forming a fourth conductive line connected to the second end of the third and fourth of the plurality of through silicon vias.

BRIEF DESCRIPTION OF THE DRAWINGS

The present invention is described in the detailed description which follows, in reference to the noted plurality of drawings by way of non-limiting examples of exemplary embodiments of the present invention.

FIG. 1A shows a perspective view of a three dimensional (3D) microstrip branchline coupler structure and respective fabrication processes in accordance with aspects of the invention.

DETAILED DESCRIPTION

The invention relates to semiconductor structures and, more particularly, to a three dimensional (3D) microstrip branchline coupler and methods of manufacture. More specifically, the present invention is directed to a 3D microstrip ultra-compact branchline coupler for millimeter wave/Terahertz applications. Advantageously, the performance of the 3D microstrip branchline coupler is equivalent to a conventional 2D microstrip branchline coupler, but with an area reduction of at least 70% at the millimeter wave/Terahertz applications.

In embodiments, the 3D microstrip branchline coupler structure implements CMOS technology enabled with a through silicon via (TSV) design. In embodiments, the TSVs can be implemented as two vertical arms, i.e., two vertical microstrip sections, connected together by horizontal conductive lines, and implemented with a ground shield structure. The impedance of each section of the 3D microstrip branchline coupler structure can be well matched to each other by the selection of the distance between the vertical signal TSV and vertical ground TSVs, as well as by the width and the separation of coplanar redistribution (RDL) wiring.

The 3D microstrip branchline coupler structures of the present invention can be manufactured in a number of ways using a number of different tools. In general, though, the methodologies and tools are used to form structures with dimensions in the micrometer and nanometer scale. The methodologies, i.e., technologies, employed to manufacture the 3D microstrip branchline coupler structures of the present invention have been adopted from integrated circuit (IC) technology. For example, the 3D microstrip branchline coupler structures are built on wafers and are realized in films of material patterned by photolithographic processes on the top of a wafer. In particular, the fabrication of the 3D microstrip branchline coupler structures uses three basic building blocks: (i) deposition of thin films of material on a substrate, (ii) applying a patterned mask on top of the films by photolithographic imaging, and (iii) etching the films selectively to the mask.

Figure 1B:
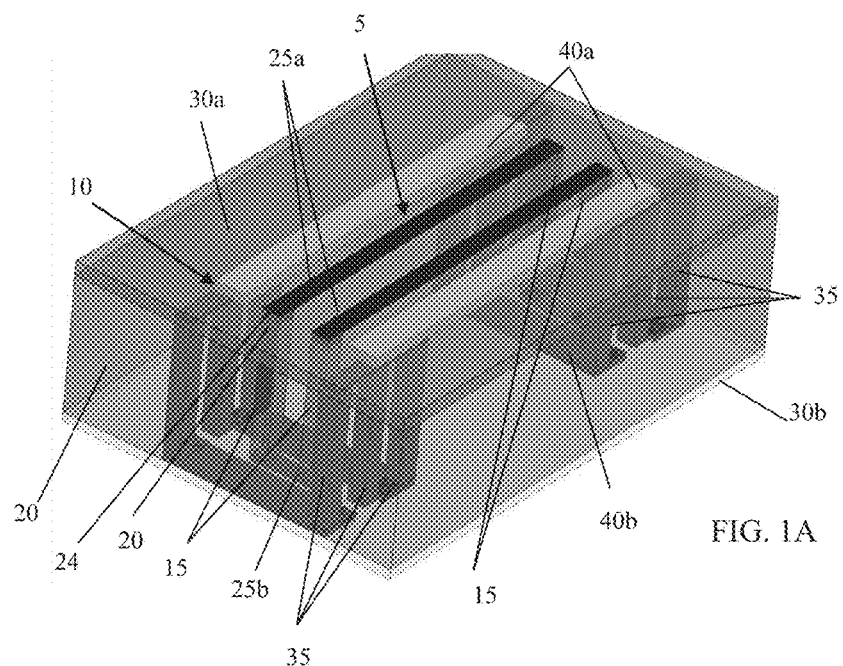
FIGS. 1B and 1C show different side views of the 3D microstrip branchline coupler structure of FIG. 1A.
Figure 1B:
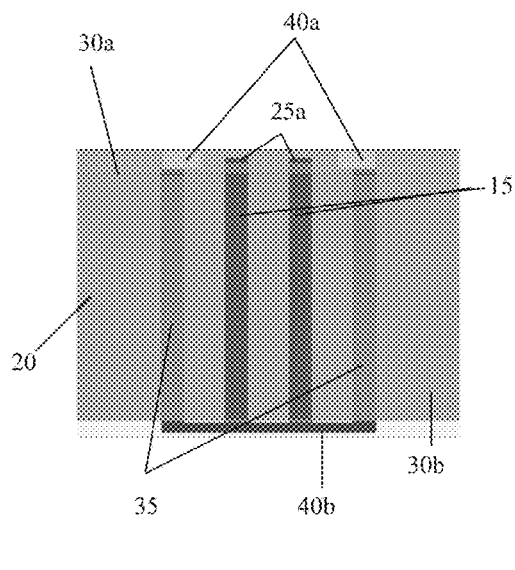
Figure 1C:
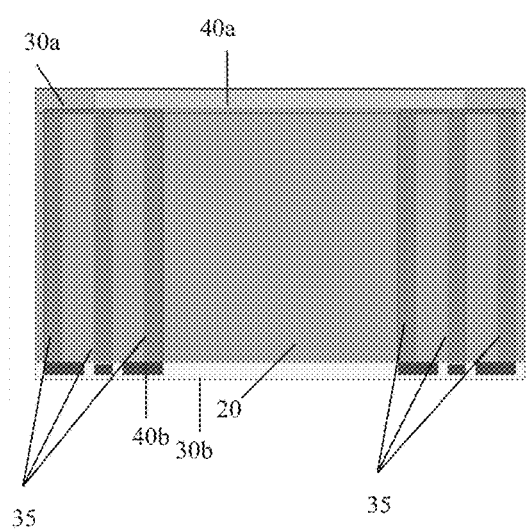

FIG. 1A shows a perspective view of a 3D microstrip branchline coupler structure and respective fabrication processes in accordance with aspects of the invention. FIGS. 1B and 1C show different side views of the microstrip branchline coupler structure of FIG. 1A. More specifically, FIGS. 1A, 1B and 1C show a 3D microstrip branchline coupler structure 5 and a ground shield structure 10 with related components.

In embodiments, the 3D microstrip branchline coupler structure 5 includes vertical arms 15 which are fabricated from through silicon vias (TSVs) 15. In embodiments, the TSVs 15 are TSV signal lines with an upper end (top) and a lower end (bottom) fabricated in a thinned semiconductor wafer 20, e.g., silicon wafer. For example, after thinning of the wafer 20 by conventional mechanical processes, holes can be drilled through the wafer, followed by a deposition of conductive material, e.g., tungsten, to form the vertical arms 15. In embodiments, the wafer 20 can be thinned to about 65 µm, and any conductive material that was deposited on the surface of the wafer 20 can be removed by a conventional chemical mechanical polishing (CMP) process.

Still referring to FIGS. 1A-1C, in embodiments, the vertical arms 15 can be electrically connected together by conductive lines 25a, 25b (e.g., microstrip lines) deposited and patterned above and below the vertical arms 15, respectively. For example, one of the conductive lines 25a can be connected to upper ends of a first and second of the plurality of through silicon vias (e.g., between port #1 and port #4 shown in FIG. 2) and another of the conductive lines 25a can be connected to upper ends of the third and fourth of the plurality of through silicon vias (e.g., between port #2 and port #3 shown in FIG. 2). In this way, the two conductive lines 25a can be coplanar, e.g, within the same layer of the structure. On the other hand, one of the conductive lines 25b can be connected to lower ends of the first and third of the plurality of through silicon vias and another of the conductive lines 25b can be connected to lower ends of the second and fourth of the plurality of through silicon vias. In this way, the two conductive lines 25b can be coplanar, e.g, within the same layer of the structure.

In embodiments, the conductive lines 25a, 25b can be a redistribution level (RDL) composed of copper contacts 22 followed by an aluminum wiring layer 24, as one illustrative example. The aluminum wiring layer can be about 1.2 microns in thickness and can have different shapes, e.g., straight or meandering (both of which are schematically represented in FIG. 1A), with an effective dielectric constant of about 4.56; although other dimensions and effective dielectric constants are contemplated by the present invention. In embodiments, the upper and lower conductive lines 25a, 25b can be fabricated orthogonal to each other as depicted in FIGS. 1A-1C; although other orientations are also contemplated by the present invention.

More specifically, a blanket deposition of one or more metal or metal alloy materials can be deposited in contact with the vertical arms 15, followed by a deposition of resist material. The resist material can be exposed to energy (e.g., light) to form a pattern (e.g., a plurality of openings). A reactive ion etching (RIE) can then be performed through the openings to form the patterned conductive lines 25a, 25b. As should be understood by those of skill in the art, the contact pads 22 and the conductive lines or strips 24 can be fabricated in separate deposition and patterning steps. After the patterning process, the resist can be removed using a conventional oxygen ashing process or other known stripants. An oxide or other insulator material 30a, 30b can then be deposited on the patterned upper and lower conductive lines 25a, 25b, respectively. The oxide or other insulator material 30a, 30b can be deposited by a chemical vapor deposition (CVD) process.

The structure further includes the ground shield structure 10, which surrounds the 3D microstrip branchline coupler structure 5. Similar to the 3D microstrip branchline coupler structure 5, the ground shield structure 10 includes vertical arms 35 which are composed of TSVs. In embodiments, the vertical arms 35 of the ground shield structure 10 are TSV ground lines fabricated at the same time and with the same processes of the vertical arms 15 of the 3D microstrip branchline coupler structure 5 as described herein. The vertical arms 35 of the ground shield structure 10 and the vertical arms 15 of the 3D microstrip branchline coupler structure 5 can have the same vertical length, e.g., 65 µm.

The ground shield structure 10 further includes upper and lower conductive lines 40a, 40b which are electrically connected to the vertical arms 35. The upper and lower conductive lines 40a, 40b can be fabricated using a stack of different conductive materials to make ground contacts. In embodiments, the stack of different conductive materials can be about 5-6 microns thick; although other dimensions also contemplated by the present invention. The upper and lower conductive lines 40a, 40b can be coplanar with the respective conductive lines 25a, 25b of the 3D microstrip branchline coupler structure 5. In embodiments, the upper and lower conductive lines 40a, 40b can be fabricated using conventional deposition, lithography and etching processes, and can be oriented orthogonal to each other as depicted in FIGS. 1A-1C; although other orientations are also contemplated by the present invention.

Figure 2:
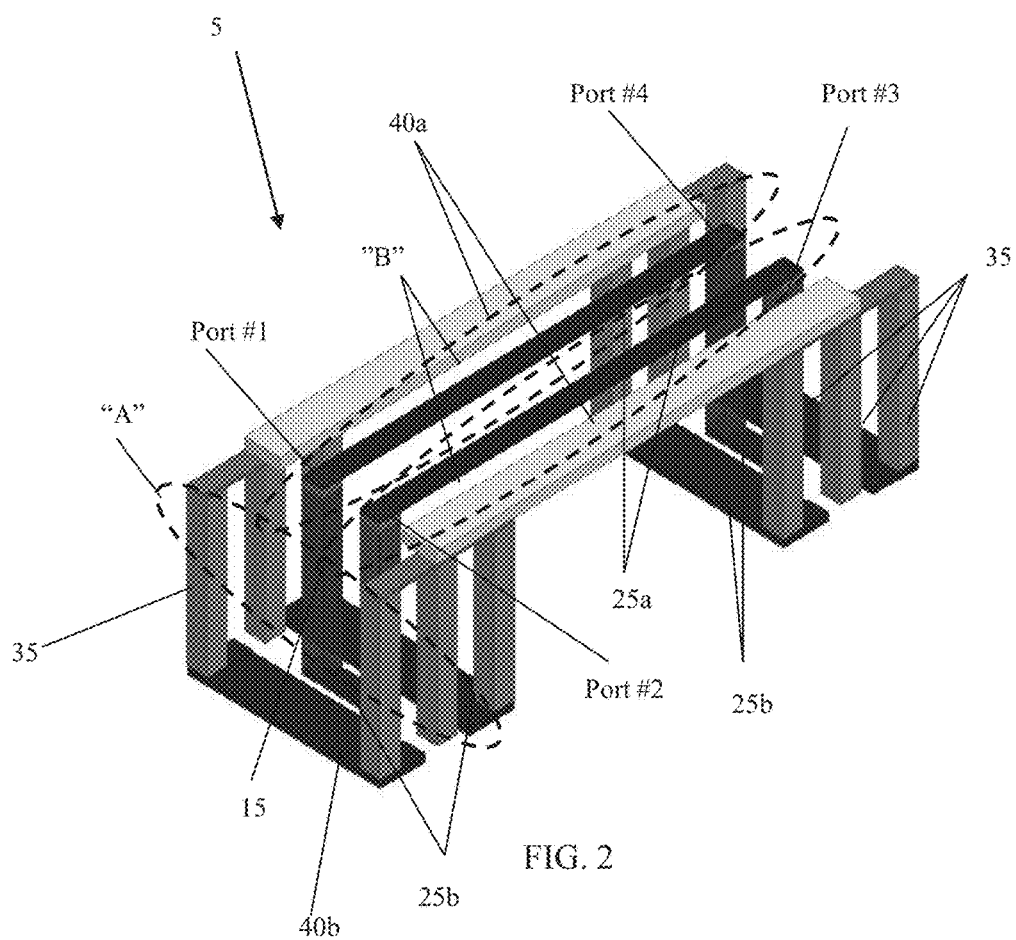
FIG. 2 shows a port assignment of the 3D microstrip branchline coupler structure 5 in accordance with aspects of the invention.

FIG. 2 shows a port assignment of the 3D microstrip branchline coupler structure 5 in accordance with aspects of the invention. In particular, the 3D microstrip branchline coupler structure 5 includes an input signal (port #1), which is split into two quadrature signals at port #2 and port #3 of equal amplitude and with 90 phase difference. For example, port #2 is 0.707 Vin<−90° and port #2 is 0.707 Vin<−180°. The remaining port #4 is isolated from the input signal, port #1.

In embodiments, the 3D microstrip branchline coupler structure 5 can have an impedance of the vertical arm 15 equal to 1/sqrt2 of the impedance of the horizontal arm (e.g., and lower conductive lines 25a, 25b) and the 90° phase shift between the two outputs at port #2 and port #3, fulfilling the operation conditions of the branchline coupler. The 90° phase shift is obtained by choosing the vertical and the horizontal arms to be equivalent to the quarter wavelength at the frequency of operation. In further embodiments, the 3D microstrip branchline coupler structure 5 can have an electrical resistance of about 30.5 ohms achieved by the vertical arms 15 and conductive lines 25b as represented by sections labeled "A"; whereas, the 3D microstrip branchline coupler structure 5 can have an electrical resistance of 42 ohms as realized in its conductive lines 25a as represented by sections labeled "B". The impedance of each section of the 3D microstrip branchline coupler structure can be well matched to each other by the selection of the distance between the vertical signal TSV and vertical ground TSVs, as well as by the width and the separation of coplanar redistribution (RDL) wiring.

The insertion loss, the phase shift between the two output ports, and the impedance of the 3D microstrip branchline coupler structure 5 are also comparable to those of a conventional microstrip branchline coupler, and each of which can be adjusted by the thickness and spacing between the different lines. The 3D microstrip branchline coupler structure 5 has the flexibility that the center frequency and size can to scaled up or down for the desired center frequency and applications, particularly into the millimeter-wave band and up to the Terahertz band.

Figure 3A:
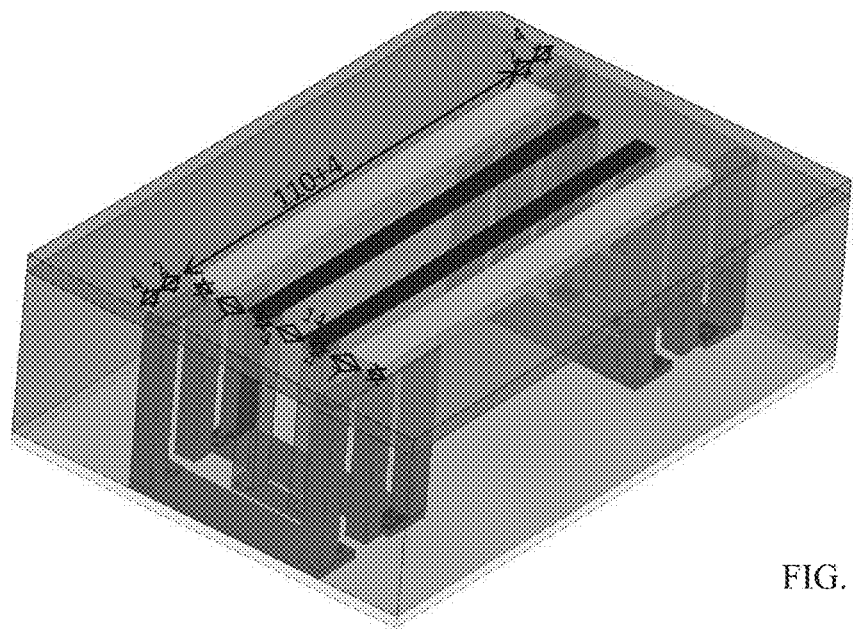
FIGS. 3A and 3B show a comparison of area of the 3D microstrip branchline coupler structure and a conventional two dimensional (2D) branchline coupler in accordance with aspects of the present invention.
Figure 3B:
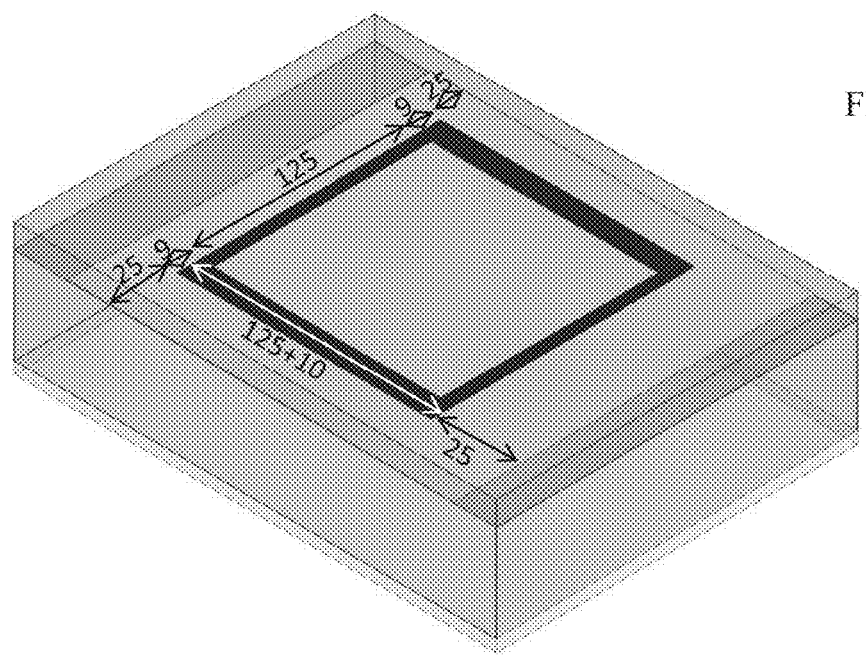

FIGS. 3A and 3B show a comparison of area of the 3D microstrip branchline coupler structure and a conventional two dimensional (2D) branchline coupler in accordance with aspects of the present invention. As shown in these comparisons, the 3D microstrip branchline coupler structure shown in FIG. 3A consumes very small chip area at millimeter-wave and Terahertz frequency bands, which makes it much more attractive than the 2D conventional branchline coupler shown in FIG. 3B or a branchline coupler using on-chip lumped passive devices.

In embodiments, the area of the 3D microstrip branchline coupler (shown in FIG. 3A) can have a reduced area of more than 70% and upwards of about 88% when the frequency is moved up from the 130 GHz Millimeter wave frequency to the 300 GHz Terahertz frequency. In the 130 GHz Millimeter wave frequency, the area reduction savings can be about 71%. This area reduction is due to the smaller quarter wavelength due to the frequency increase.

In more specific embodiments, the scaling of the 3D microstrip branchline coupler up to the Terahertz frequency of about 300 GHz can have an area reduction of about 85%, with further reduction in area obtained by meandering the horizontal sections as shown by the following comparison tables for a 300 GHZ design.

Conventional 2D Branchline Coupler

Effective Dielectric Constant is 4.1

| | |
|---|---|
| First length: Length of signal line + 2*half signal width + 2*extra ground width | (125 μm) + 2*9 μm(width of a 35.35 ohm line is 18 μm) = 193 μm. |
| Second length: Length of signal line + 2*half signal width + 2*extra ground width | (125 μm + 2*5 μm) + 2*25 μm (width of 50 ohm line is 10 μm) = 185 μm |
| Area | 193 μm * 185 μm = 35705 μm² |

3D Branchline Coupler

TSV=31 μm Length; 4 μm Length of RDL

| | |
|---|---|
| First length: Signal Length of signal line + 2*half TSV + 2*TSV pitch + 2* TSV side | (110 μm + 4 μm) + (2*2 μm) + (2*4 μm) = 126 μm |
| Second length: 4*TSV side + 2* TSV pitch + gap between 2 signal TSV | (4*4 μm) + (2*7 μm) + 14 = 44 μm |
| Area | 126 μm * 44 μm = 5544 μm² |

By comparing the area of the 2D conventional branchline coupler to the 3D branchline coupler in accordance with aspects of the invention, it is seen that an area reduction of 88.47% is achieved (i.e., 5544 μm/35705 μm=0.155 or 84.47% area reduction).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a plurality of through silicon vias; and
conductive lines electrically connected to a first end and a second end of respective ones of the plurality of through silicon vias, wherein:
a first through silicon via of the plurality of through silicon vias forms a first port of a three dimensional (3D) branchline coupler;
a second through silicon via of the plurality of through silicon vias forms a second port of the 3D branchline coupler;
a third through silicon via of the plurality of through silicon vias forms a third port of the 3D branchline coupler; and
a fourth through silicon via of the plurality of through silicon vias forms a fourth port of the 3D branchline coupler.

2. The structure of claim 1, wherein the first port is an input signal port.

3. The structure of claim 2, wherein the input signal port is split into two quadrature signals at the second port and the third port.

4. The structure of claim 3, wherein the two quadrature signals at the second port and the third port are of equal amplitude and with 90 phase difference.

5. The structure of claim 3, wherein the second port is 0.707 Vin<−90° and the second port is 0.707 Vin<−180°.

6. The structure of claim 5, wherein the fourth port is isolated from the input signal port.

7. The structure of claim 1, further comprising a ground shield surrounding the 3D branchline coupler.

8. The structure of claim 7, wherein the ground shield includes a plurality of through silicon vias electrically connected by conductive lines.

9. The structure of claim 7, wherein the conductive lines of the ground shield are coplanar with the conductive lines electrically connected to the upper portion and the lower portion of respective ones of the plurality of through silicon vias of the 3D branchline coupler.

10. The structure of claim 1, wherein the conductive lines electrically connected to the first end and the second end of respective ones of the plurality of through silicon vias of the 3D branchline coupler are straight.

11. The structure of claim 1, wherein the conductive lines electrically connected to the first end and the second end of respective ones of the plurality of through silicon vias of the 3D branchline coupler are meandering.

12. The structure of claim 1, wherein:
a first of the conductive lines electrically connected to the first end of the first and third of the plurality of through silicon vias between the first port and the third port;
a second of the conductive lines are connected to the first end of the second and fourth of the plurality of through silicon vias between the second port and the fourth port;
a third of the conductive lines are connected to the second end of the first and second of the plurality of through silicon vias; and
a fourth of the conductive lines are connected to the second end of the third and fourth of the plurality of through silicon vias.

13. A structure comprising:
a first through silicon via forming a first port of a three dimensional (3D) branchline coupler;
a second through silicon via forming a second port of the 3D branchline coupler;
a third through silicon via forming a third port of the 3D branchline coupler;
a fourth through silicon via forming a fourth port of the 3D branchline coupler;
a first conductive line electrically connected to a first end of the first and third of the plurality of through silicon vias between a first port and a third port;
a second conductive line connected to the first end of the second and fourth of the plurality of through silicon vias between a second port and a fourth port;
a third conductive line connected to a second end of the first and second of the plurality of through silicon vias; and
a fourth conductive line connected to the second end of the third and fourth of the plurality of through silicon vias.

14. The structure of claim 13, wherein:
the first port is an input signal port;
the input signal port is split into two quadrature signals at the second port and the third port; and
the two quadrature signals at the second port and the third port are of equal amplitude and with 90 phase difference.

15. The structure of claim 14, wherein the second port is 0.707 Vin<−90° and the third port is 0.707 Vin<−180°.

16. The structure of claim 14, wherein at least the first and second conductive lines are meandering.

17. The structure of claim 14, further comprising a ground shield surrounding the 3D branchline coupler.

18. The structure of claim 17, wherein the ground shield includes a plurality of through silicon vias electrically connected by conductive lines, and wherein the conductive lines of the ground shield are coplanar with the conductive lines of the 3D branchline coupler.

19. A method, comprising:
forming a first through silicon via forming a first port of a three dimensional (3D) branchline coupler;
forming a second through silicon via forming a second port of the 3D branchline coupler;
forming a third through silicon via forming a third port of the 3D branchline coupler;
forming a fourth through silicon via forming a fourth port of the 3D branchline coupler;
forming a first conductive line electrically connected to a first end of the first and third of the plurality of through silicon vias between a first port and third port;
forming a second conductive line connected to the first end of the second and fourth of the plurality of through silicon vias between a second port and a fourth port;
forming a third conductive line connected to a second end of the first and second of the plurality of through silicon vias; and
forming a fourth conductive line connected to the second end of the third and fourth of the plurality of through silicon vias.

20. The method of claim 19, further comprising forming a ground shield about the 3D branchline coupler.

* * * * *